US010043771B2

United States Patent
Fujii et al.

(10) Patent No.: US 10,043,771 B2
(45) Date of Patent: Aug. 7, 2018

(54) SEMICONDUCTOR DEVICE WITH INSULATION LAYERS

(71) Applicant: ROHM CO., LTD., Kyoto-shi, Kyoto (JP)

(72) Inventors: Kenji Fujii, Kyoto (JP); Mamoru Yamagami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 31 days.

(21) Appl. No.: 15/221,375

(22) Filed: Jul. 27, 2016

(65) Prior Publication Data

US 2017/0040243 A1    Feb. 9, 2017

(30) Foreign Application Priority Data

Aug. 5, 2015 (JP) .................. 2015-155187

(51) Int. Cl.
*H01L 23/00* (2006.01)
*H01L 23/31* (2006.01)
*H01L 21/48* (2006.01)
*H01L 23/495* (2006.01)

(52) U.S. Cl.
CPC .......... *H01L 24/03* (2013.01); *H01L 21/4853* (2013.01); *H01L 23/3171* (2013.01); *H01L 23/3192* (2013.01); *H01L 24/08* (2013.01); *H01L 24/29* (2013.01); *H01L 23/3121* (2013.01); *H01L 23/49541* (2013.01); *H01L 2224/0401* (2013.01); *H01L 2224/16245* (2013.01); *H01L 2224/81815* (2013.01); *H01L 2924/3512* (2013.01)

(58) Field of Classification Search
CPC combination set(s) only.
See application file for complete search history.

(56) References Cited

U.S. PATENT DOCUMENTS

| 6,133,637 A * | 10/2000 | Hikita ............... G01P 3/488 257/666 |
| 2016/0254214 A1* | 9/2016 | Makino ............... H01L 24/97 257/676 |
| 2016/0276173 A1* | 9/2016 | Song ............... H01L 23/49816 |
| 2017/0005074 A1* | 1/2017 | Chen ............... H01L 21/76804 |

FOREIGN PATENT DOCUMENTS

JP    2013-157647 A    8/2013

* cited by examiner

*Primary Examiner* — Marcos D Pizarro
*Assistant Examiner* — Shannon Yi
(74) *Attorney, Agent, or Firm* — Hamre, Schumann, Mueller & Larson, P.C.

(57) ABSTRACT

A semiconductor device includes a semiconductor chip, a terminal layer, an insulation layer with an opening, a protection layer with an opening, an inner conductive member, an outer conductive member, and a conductive bonding member. The insulation layer includes a first insulation layer, and a second insulation layer opposite to the functional surface of the chip with respect to the first insulation layer. The second insulation layer includes a shield portion overlapping with the terminal layer in plan view, and a retracted portion not overlapping with the terminal layer in plan view. A back surface of the retracted portion of the second insulation layer is more distant from the functional surface in a z-direction than is the main surface of the terminal layer that is opposite to the functional surface.

27 Claims, 8 Drawing Sheets

SEMICONDUCTOR DEVICE WITH INSULATION LAYERS

BACKGROUND OF THE INVENTION

1. Field of the Invention

The present invention relates to a semiconductor device.

2. Description of the Related Art

Conventionally, semiconductor devices of flip-chip bonding type have been proposed. In such a semiconductor device, its functional-surface side is bonded to the external conductive members on a substrate via solder bumps, for example (see JP-A-No. 2013-157647). A semiconductor device of flip-chip bonding type is advantageous for improving production efficiency in that no wire bonding process is needed. In addition, the device can have a small resistance between the semiconductor chip and each external conductive member.

Generally a semiconductor chip and an external conductive member on a substrate may be significantly different in linear expansion coefficient from each other. By the flip-chip bonding, the semiconductor chip and the external conductive member are disposed very close to each other via a solder bump, and thus thermal distortion may often occur between the semiconductor chip and the external conductive member. Such thermal distortion may cause an undesired crack in the insulation layer provided between the semiconductor chip and the external conductive member.

SUMMARY OF THE INVENTION

The present invention has been proposed in view of the foregoing situation. It is therefore an object of the invention to provide a semiconductor device capable of suppressing the occurrence of a crack in an insulation layer.

According to an aspect of the present invention, there is provided a semiconductor device that includes: a semiconductor chip having a functional surface on which an integrated circuit is formed; a terminal layer formed on the functional surface; an insulation layer covering a part of the terminal layer and formed with an insulation layer opening exposing another part of the terminal layer; a protection layer covering the insulation layer and formed with a protection layer opening exposing a part of the terminal layer; an inner conductive member that is held in contact with a terminal layer main surface of the terminal layer, that extends through the insulation layer opening and the protection layer opening, and that is exposed from the protection layer; an outer conductive member disposed at a position facing the functional surface; and a conductive bonding member that connects the inner conductive member and the outer conductive member. Further, the insulation layer includes a first insulation layer and a second insulation layer located opposite to the functional surface with respect to the first insulation layer. The second insulation layer includes a second insulation layer shield portion and a second insulation layer retracted portion, where the second insulation layer shield portion overlaps with the terminal layer in plan view, while the second insulation layer retracted portion does not overlap with the terminal layer in plan view. The second insulation layer retracted portion has a second insulation layer front surface and a second insulation layer back surface closer to the functional surface than is the second insulation layer front surface, where the second insulation layer back surface is disposed more distant from the functional surface than is the terminal layer main surface in a direction in which the functional surface faces.

Other features and advantages of the present invention will become more apparent from detailed description given below with reference to the accompanying drawings.

DETAILED DESCRIPTION OF THE PREFERRED EMBODIMENTS

Embodiments of the present invention will be described below with reference to the accompanying drawings.

Figure 1:
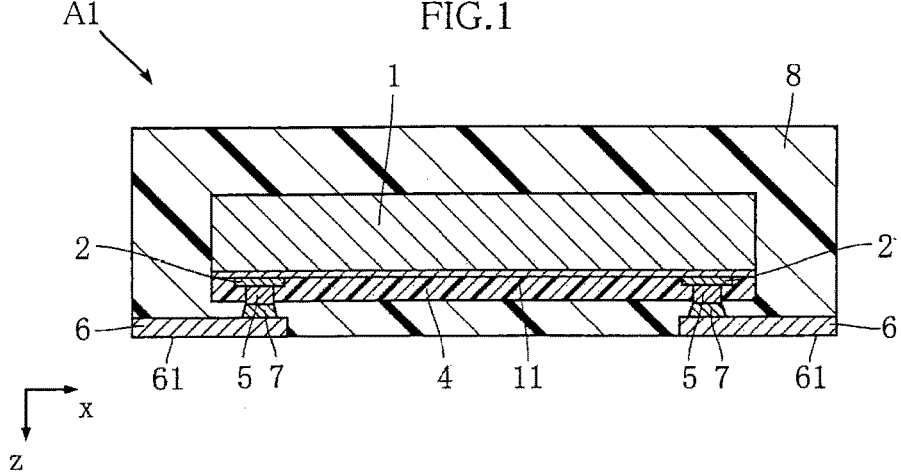
FIG. 1 is a cross-sectional view showing a semiconductor device according to a first embodiment of the present invention.
Figure 2:
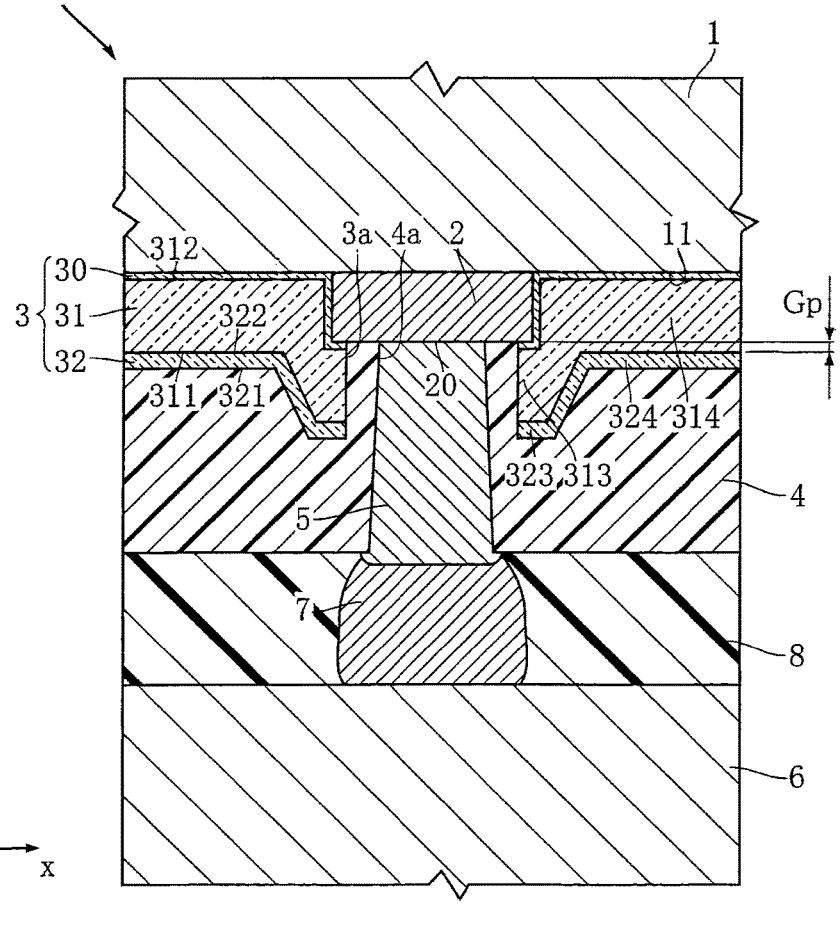
FIG. 2 is an enlarged fragmentary cross-sectional view of the semiconductor device shown in FIG. 1.

FIG. 1 and FIG. 2 illustrate a semiconductor device according to a first embodiment of the present invention. The semiconductor device A1 of this embodiment includes a semiconductor chip 1, a chip-side terminal layer 2, an insulation layer 3, a protection layer 4, inner conductive members 5, outer conductive members 6, conductive bonding members 7 and a sealing resin 8. In the semiconductor device A1, the semiconductor chip 1 is attached to the outer conductive members 6 by flip chip bonding. The illustrated example depicts a semiconductor device of QFN (quad for non-lead) package type. The invention, however, is not limited to this package type, and another packaging such as BGA (ball grid array) package may be employed.

FIG. 1 is an overall cross-sectional view showing the semiconductor device A1. FIG. 2 is an enlarged fragmentary cross-sectional view showing the junction between the terminal layer 2 and an outer conductive member 6.

The semiconductor chip 1 includes a substrate formed of Si, for example. The semiconductor chip 1 includes a functional surface 11, on which an integrated circuit or circuits may be formed. The z-direction in the drawings is the direction in which the functional surface 11 faces. For the sake of clearer understanding, the functional surface 11 in FIG. 2 is illustrated as a simple flat surface that the semiconductor chip 1 has. Actually, there may be formed an interconnecting layer, for example, for connecting the integrated circuit(s) and the terminal layer 2 that is to be located at a predetermined position in plan view of the functional surface 11. When such an interconnect layer is formed, the surface of the interconnect layer may also form a part of the functional surface 11.

The terminal layer 2 is in contact with conductors formed on the functional surface 11 of the semiconductor chip 1, thereby being electrically connected to the integrated circuit(s) on the functional surface 11. The terminal layer 2 is divided into physically separated regions arranged along the edges of a rectangle or in a matrix pattern in a plan view. FIG. 2 illustrates one of such regions. In this embodiment the terminal layer 2 is formed of Al for example, though the material of the terminal layer 2 is not limited to this. The terminal layer has a main surface 20 facing in the z-direction. The terminal layer 2 has a thickness of approximately 1.0 µm to 4.0 µm, for example.

The insulation layer 3 partially covers the terminal layer 2 to prevent the terminal layer 2 from being electrically connected to unintended portions. The insulation layer 3 also serves to restrict intrusion of outside air or moisture into the functional surface 11 of the semiconductor chip 1. The insulation layer 3 may often be referred to as passivation layer. In this embodiment, the insulation layer 3 includes an underlying insulation layer 30, a first insulation layer 31, and a second insulation layer 32.

The underlying insulation layer 30 is closest to the semiconductor chip 1, and formed to contact with the functional surface 11 of the semiconductor chip 1 and the main surface 20 of the terminal layer 2. The underlying insulation layer 30 is formed of a nitride such as SiN. The underlying insulation layer 30 has a thickness of 0.1 µm to 0.6 µm, for example.

The first insulation layer 31 is laid on the underlying insulation layer 30. The first insulation layer 31 is formed of an oxide such as $SiO_2$. The first insulation layer 31 has a thickness of 1.0 µm to 5.0 µm, for example. The first insulation layer 31 includes a main surface 311 and a back surface 312. The main surface 311 faces in the same direction as the functional surface 11. The back surface 312 is opposed to the functional surface 11 and, in this embodiment, held in contact with the underlying insulation layer 30.

The first insulation layer 31 also includes a shield portion 313 and a retracted portion 314. The shield portion 313 is located so as to overlap with the terminal layer 2 in a plan view (or as viewed in the z-direction). The retracted portion 314 is formed in a region offset from the terminal layer 2 in a plan view.

The second insulation layer 32 is laid on the first insulation layer 31, and located opposite to the functional surface 11 with respect to the first insulation layer 31. The second insulation layer 32 is formed of a nitride such as SiN. The second insulation layer 32 has a thickness of 0.7 µm to 3.5 µm, for example. The second insulation layer 32 includes a main surface 321 and a back surface 322. The main surface 321 faces in the same direction as the functional surface 11. The back surface 322 is opposed to the functional surface 11 and, in this embodiment, held in contact with the main surface 311 of the first insulation layer 31.

The second insulation layer 32 also includes a shield portion 323 and a retracted portion 324. The shield portion 323 is located to overlap with the terminal layer 2, as well as the shield portion 313 of the first insulation layer 31, in a plan view. The retracted portion 324 is formed in a region offset from the terminal layer 2 in a plan view, but overlaps with the retracted portion 314 of the first insulation layer 31.

Further, the insulation layer 3 is formed with an opening (or through-hole) 3a that penetrates through the insulation layer 3 in the thickness direction (z-direction). The opening 3a exposes a part of the terminal layer 2. In this embodiment, the opening 3a exposes a central region of the terminal layer 2. The inner wall of the opening 3a is formed by the respective inner surfaces of the underlying insulation layer 30, the first insulation layer 31, and the second insulation layer 32. The inner surfaces of the underlying insulation layer 30, first insulation layer 31 and second insulation layer 32 are flush with each other.

In the second insulation layer 32, as shown in FIG. 2, the back surface 322 of the retracted portion 324 is more distant from the functional surface 11 in the z-direction than is the main surface 20 of the terminal layer 2. In other words, More specifically, the back surface 322 is located offset by a distance Gp in the z-direction from the main surface 20 of the terminal layer 2. To this end, the retracted portion 314 of the first insulation layer 31 is made thicker than the terminal layer 2.

The protection layer 4 protects the functional surface 11 of the semiconductor chip 1, the terminal layer 2, and the insulation layer 3. The protection layer 4 is laid on the insulation layer 3. In this embodiment, the protection layer 4 covers the main surface 321 of the second insulation layer 32 of the insulation layer 3. The protection layer 4 is formed of an insulative resin such as a polyimide resin. The protection layer 4 has a thickness of 5 µm to 20 µm, for example.

The protection layer 4 is formed with an opening 4a, which exposes a part of the terminal layer 2. In this embodiment, the opening 4a exposes a central region of the terminal layer 2. In addition, the opening 4a is contained within the diametrically larger opening 3a, in a plan view. In this embodiment, the inner wall of the opening 3a is directly covered with the protection layer 4.

As shown in FIG. 2, the inner conductive member 5 has an upper end that is held in direct contact with the terminal layer 2 and a lower end exposed from the protection layer 4, while extending vertically through the opening 3a of the insulation layer 3 and the opening 4a of the protection layer 4. In this embodiment, the inner conductive member 5 is formed to fill in the opening 4a of the protection layer 4. In this embodiment the inner conductive member 5 may be made of Cu, though the material of the inner conductive member 5 is not limited to this.

As shown in FIG. 1, each of the outer conductive members 6 is so located as to at least partially oppose or face (via certain intervening elements or portions) the functional surface 11. The outer conductive members 6 are each formed of a metal, such as Cu, Ni, or Fe, or an alloy thereof. The outer conductive members 6 each include a mounting surface 61. The mounting surface 61 is utilized to mount the semiconductor device A1 on a non-illustrated circuit board, for example. In this embodiment the outer conductive member 6 is provided by a lead frame, though the invention is not limited to this. Alternatively, the outer conductive member 6 may be provided by a conductive substrate, for example.

As shown in FIG. 2, each conductive bonding member 7 is held in direct contact with the inner conductive member 5 and the outer conductive member 6 so as to electrically connect the two members 5, 6 to each other. The conductive bonding member 7 may be made of solder, for example, though the invention is not limited to this.

As shown in FIG. 1, the sealing resin 8 covers the semiconductor chip 1 for protection. Further, the sealing resin 8 covers a part of each outer conductive member 6 while letting the remaining part of the outer conductive member 6 exposed to the outside. In this embodiment, the exposed lower surface of the outer conductive member 6, which faces in the z-direction, is used as a mounting surface 61. For the sealing resin 8, use may be made of a black epoxy resin with a filler mixed therein, though the invention is not limited to this.

In this embodiment, the sealing resin 8 (hence the semiconductor device A1) may have a rectangular shape in a plan view. The outer conductive members 6 do not protrude from the sealing resin 8 in a plan view. The outer conductive members 6 are arranged along the peripheral edge of the sealing resin 8 in a plan view.

Referring now to FIG. 3 to FIG. 11, an example of a manufacturing method of the semiconductor device A1 will be described below.

Figure 3:
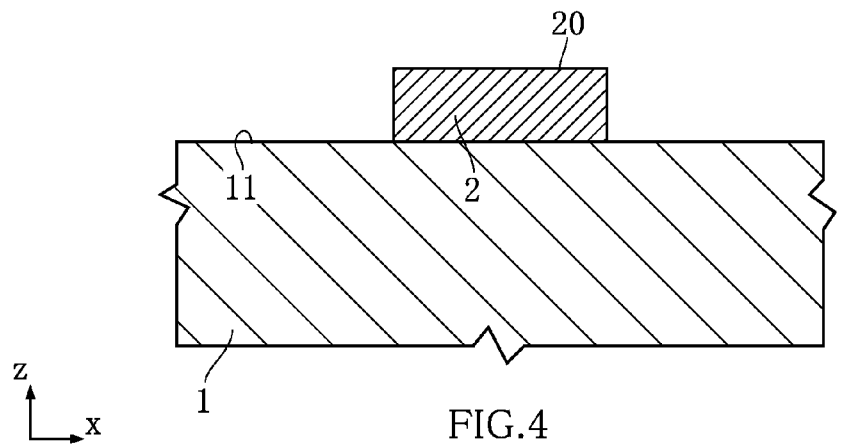
FIG. 3 is an enlarged fragmentary cross-sectional view for explaining a manufacturing method of the semiconductor device shown in FIG. 1.

Referring first to FIG. 3, the semiconductor chip 1 having a required number of integrated circuits formed on the functional surface 11 is prepared, and the terminal layer 2 is formed on the functional surface 11. The terminal layer 2 may be formed by plating an Al layer.

Figure 4:
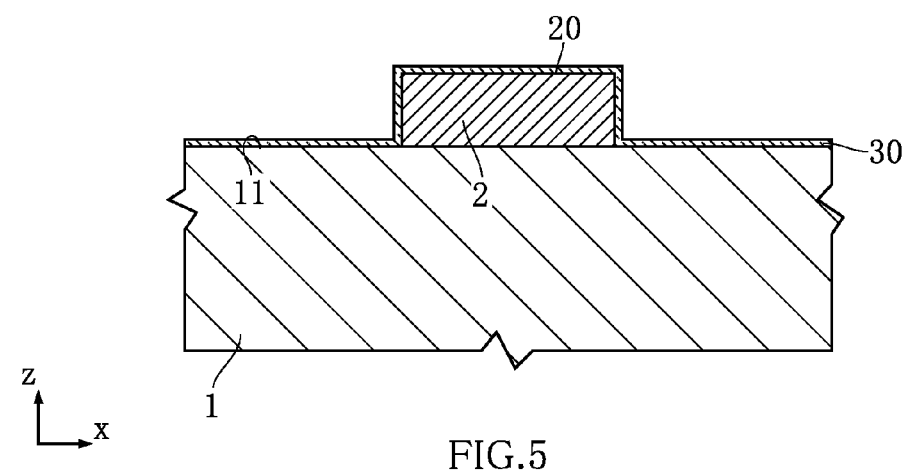
FIG. 4 is an enlarged fragmentary cross-sectional view for explaining the manufacturing method of the semiconductor device shown in FIG. 1.

Then the underlying insulation layer 30 is formed, as shown in FIG. 4. The underlying insulation layer 30 may be formed, for example, by forming a thin film of SiN through a thin film deposition process such as CVD, so as to cover the functional surface 11 of the semiconductor chip 1 and the terminal layer 2. The underlying insulation layer 30 may be formed in a thickness of, for example, 0.1 μm to 0.6 μm.

Figure 5:
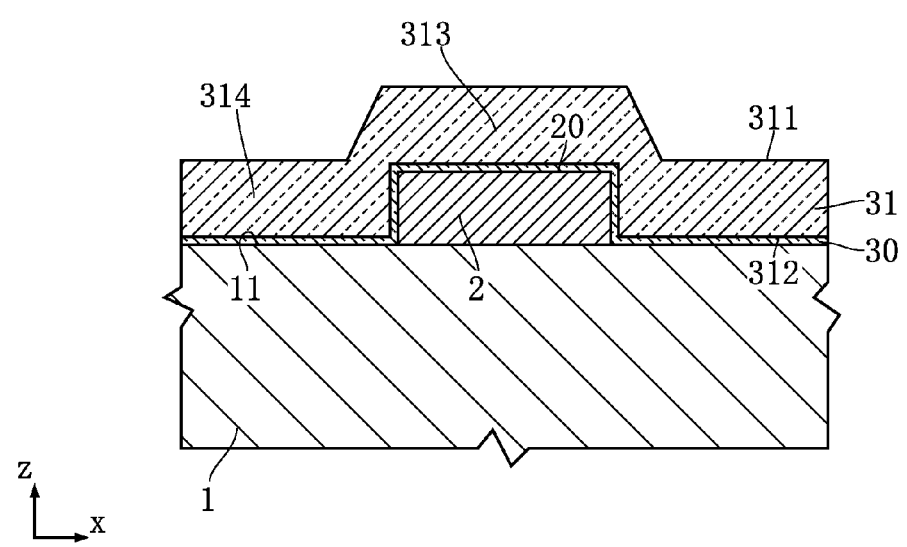
FIG. 5 is an enlarged fragmentary cross-sectional view for explaining the manufacturing method of the semiconductor device shown in FIG. 1.

Then the first insulation layer 31 is formed as shown in FIG. 5. The first insulation layer 31 may be formed, for example, by forming a thin film of $SiO_2$ through a thin film deposition process such as CVD, so as to cover the underlying insulation layer 30. The first insulation layer 31 may be formed in a thickness of, for example, 1.0 μm to 5.0 μm.

Figure 6:
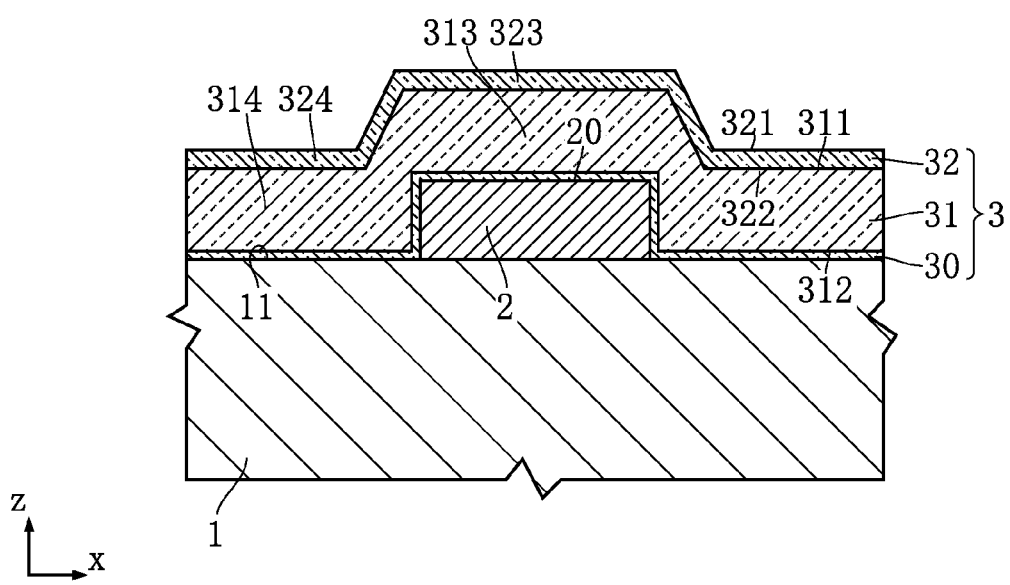
FIG. 6 is an enlarged fragmentary cross-sectional view for explaining the manufacturing method of the semiconductor device shown in FIG. 1.

Then the second insulation layer 32 is formed as shown in FIG. 6. The second insulation layer 32 may be formed, for example, by forming a thin film of SiN through a thin film deposition process such as CVD, so as to cover the first insulation layer 31. The second insulation layer 32 may be formed in a thickness of, for example, 0.7 μm to 3.5 μm. Through the foregoing process, the insulation layer 3 composed of the underlying insulation layer 30, the first insulation layer 31, and the second insulation layer 32 is obtained.

Figure 7:
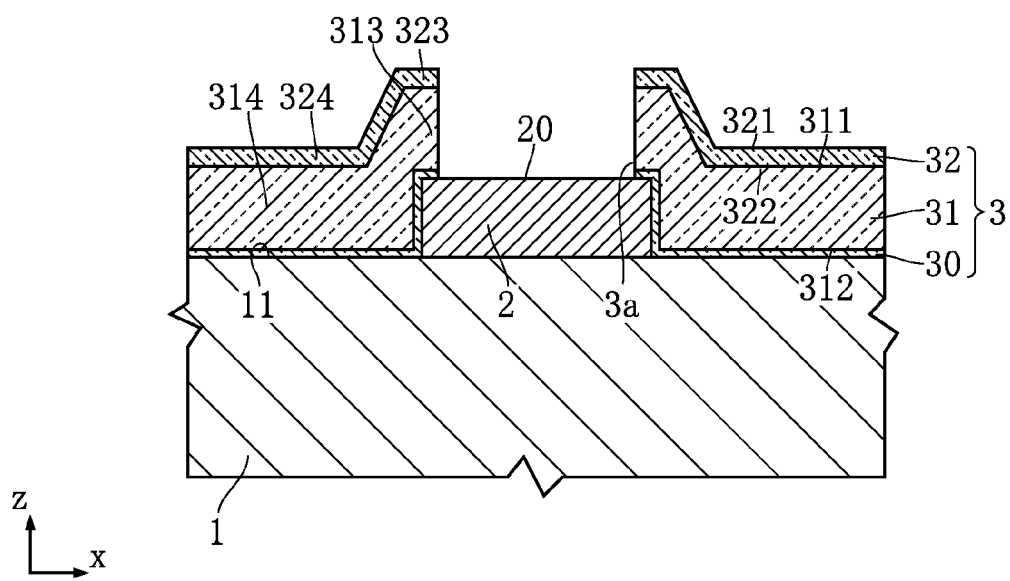
FIG. 7 is an enlarged fragmentary cross-sectional view for explaining the manufacturing method of the semiconductor device shown in FIG. 1.

Proceeding to FIG. 7, an opening 3a is formed in the insulation layer 3. The opening 3a may be formed, for example, by forming a mask on the insulation layer 3 shown in FIG. 6 by photolithography, and etching the insulation layer 3 using the mask.

Figure 8:
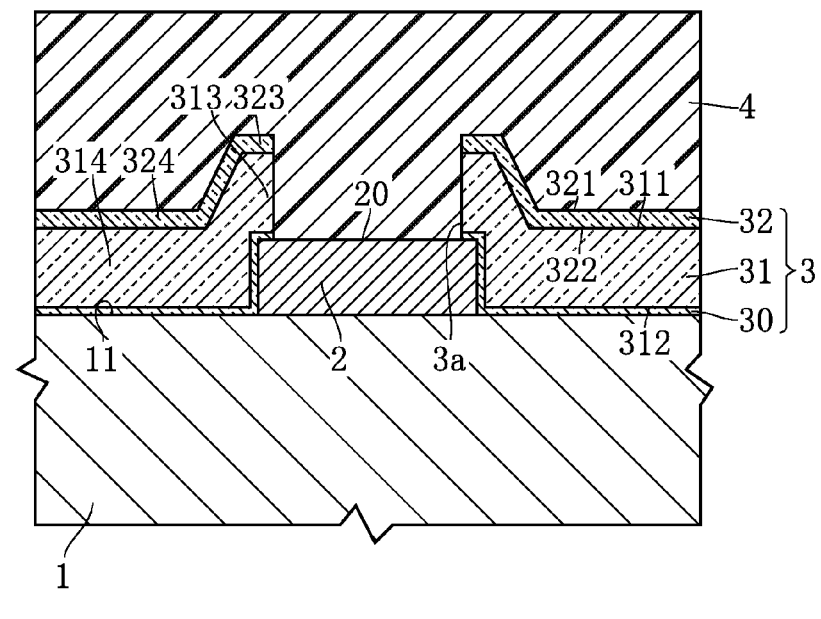
FIG. 8 is an enlarged fragmentary cross-sectional view for explaining the manufacturing method of the semiconductor device shown in FIG. 1.

Then the protection layer 4 is formed as shown in FIG. 8. The protection layer 4 may be formed, for example, by forming a thin film of a polyimide resin through a thin film deposition process such as CVD, so as to cover the insulation layer 3 and the terminal layer 2. The protection layer 4 may be formed in a thickness of, for example, 5 μm to 20 μm.

Figure 9:
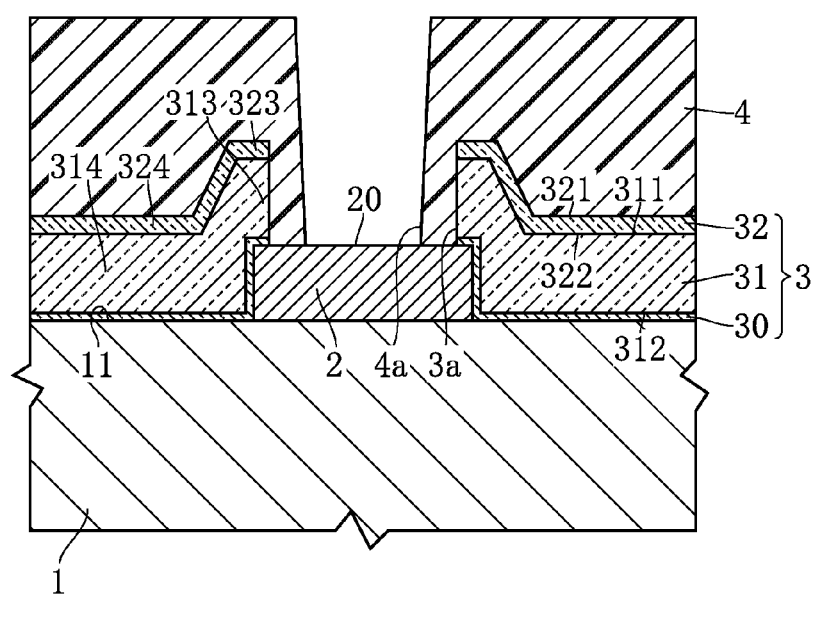
FIG. 9 is an enlarged fragmentary cross-sectional view for explaining the manufacturing method of the semiconductor device shown in FIG. 1.

Proceeding to FIG. 9, an opening 4a is formed in the protection layer 4. The opening 4a may be formed, for example, by forming a mask on the protection layer 4 shown in FIG. 8 by photolithography, and etching the protection layer 4 using the mask. In this embodiment, the opening 4a is formed in a smaller diameter than the opening 3a, so as to be enclosed inside the opening 3a in a plan view.

Figure 10:
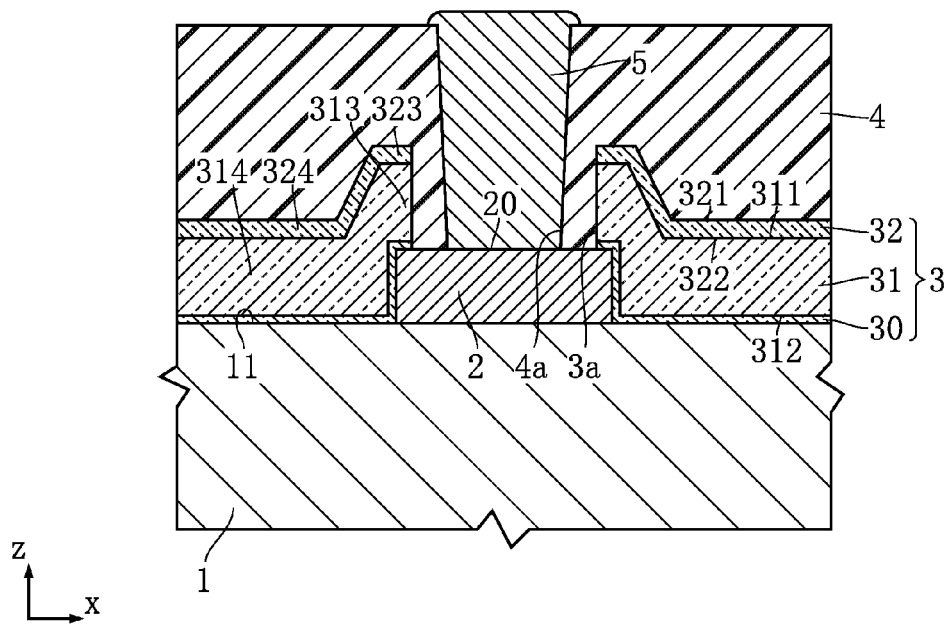
FIG. 10 is an enlarged fragmentary cross-sectional view for explaining the manufacturing method of the semiconductor device shown in FIG. 1.

Proceeding further to FIG. 10, the inner conductive member 5 is formed. The inner conductive member 5 may be formed, for example, by depositing Cu by plating so as to fill in the opening 4a.

Figure 11:
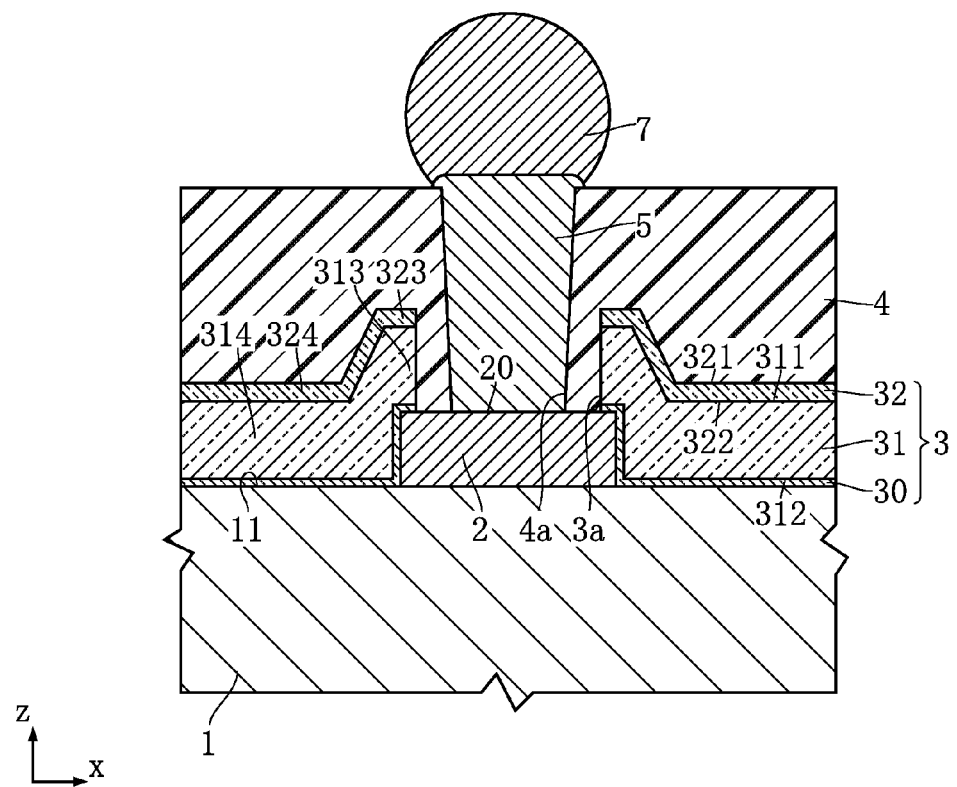
FIG. 11 is an enlarged fragmentary cross-sectional view for explaining the manufacturing method of the semiconductor device shown in FIG. 1.

Then, as shown in FIG. 11, a conductive bonding member is formed. The conductive bonding member 7 may be obtained, for example, upon forming a solder ball so as to contact the inner conductive member 5.

Thereafter, the semiconductor chip 1, now with the terminal layer 2, the insulation layer 3, the protection layer 4, and the inner conductive member 5, is bonded to a required number of outer conductive members 6 each of a predetermined shape located at a predetermined position, by melting the respective conductive bonding members 7, for example, by reflow soldering. Then the sealing resin 8 covering the semiconductor chip 1 is formed, for example by mold forming. Through the foregoing process, the semiconductor device A1 can be obtained.

Advantages of the semiconductor device A1 will now be described below.

In this embodiment, as shown in FIG. 2, the portion of the main surface 311 of the first insulation layer 31 corresponding to the retracted portion 314 is disposed more distant from the functional surface 11 in the z-direction than is the main surface 20 of the terminal layer 2. Such a configuration prevents a portion of the first insulation layer 31 (insulation layer 3) between the shield portion 313 and the retracted portion 314 from becoming unduly constricted. As the above-mentioned portion of the insulation layer 3 becomes more constricted, it will undergo larger thermal stress. In this embodiment, however, the thermal stress can be mitigated by preventing the above-mentioned portion from being excessively constricted. Accordingly, it is possible to suppress the occurrence of a crack in the insulation layer 3.

The inventors carried out an experiment with experimental samples in which, unlike in this embodiment, the portion of the main surface 311 of the first insulation layer 31 corresponding to the retracted portion 314 was closer to the functional surface 11 in the z-direction than was the main surface 20 of the terminal layer 2. The result is that a crack was found in two out of five samples, after 300 cycles of thermal cycle test. The thermal cycle test carried out in the experiments included subjecting the samples to an environment temperature of −60° C. and 150° C. alternately. In contrast, after 300 cycles of the thermal cycle test with respect to the semiconductor device A1, none of five samples of the semiconductor device A suffered a crack. It was after 1000 cycles of the thermal cycle test that a crack appeared in two out of the five samples of the semiconductor device A1. The result of the experiment shows that the configuration of the semiconductor device A1 suppresses the occurrence of a crack in the insulation layer 3.

In the embodiment explained above, the outer conductive member 6 is formed of a lead frame. The semiconductor chip (provided by a semiconductor such as Si) and the outer conductive member 6 (formed of a metal lead frame) are largely different in linear expansion coefficient from each other. Hence, by connecting such outer conductive member 6 to the terminal layer 2 via the inner conductive member 5 and the conductive bonding member 7, the insulation layer 3 may suffer a certain amount of thermal stress. According to this embodiment, it is possible to suppress the occurrence of a crack in the insulation layer 3 by alleviating the aforementioned constriction in the insulation layer 3. Thus, in the semiconductor device A1 constituted as a QFN package in which the semiconductor chip 1 is attached to the outer conductive members 6 by flip-chip bonding, the occurrence of a crack in the insulation layer 3 can be suppressed.

FIG. 12 to FIG. 15 illustrate other embodiments of the present invention. In these drawings, the elements same as or similar to those of the foregoing embodiment are indicted by the same references.

Figure 12:
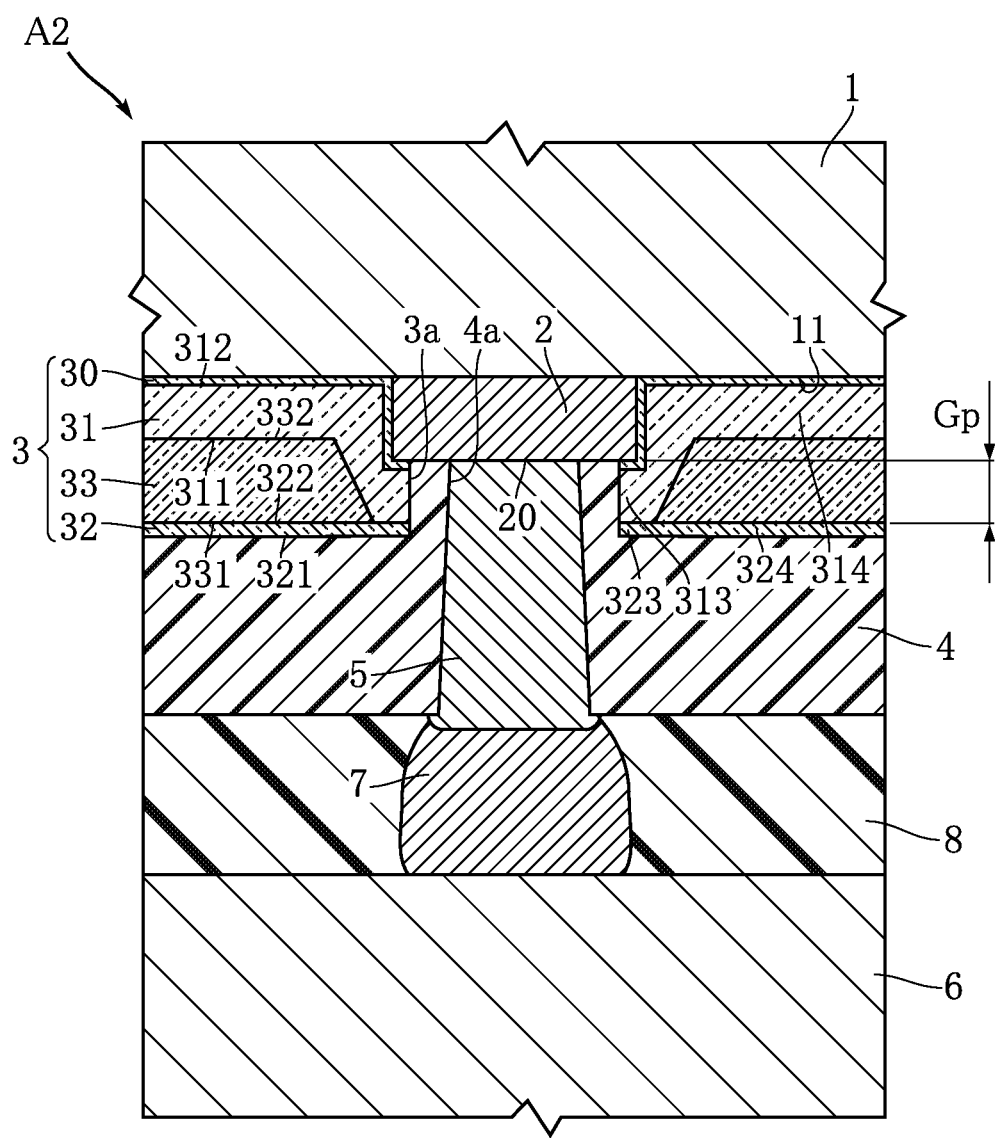
FIG. 12 is an enlarged fragmentary cross-sectional view showing a semiconductor device according to a second embodiment of the present invention.

FIG. 12 illustrates a semiconductor device according to a second embodiment of the present invention. The semiconductor device A2 of this embodiment is different from the semiconductor device A1 mainly in the configuration of the insulation layer 3.

In the second embodiment, the insulation layer 3 includes an underlying insulation layer 30, a first insulation layer 31, a second insulation layer 32, and an intermediate insulation layer 33. The intermediate insulation layer 33 is disposed between the retracted portion 314 of the first insulation layer 31 and the retracted portion 324 of the second insulation layer 32. In this embodiment also, the shield portion 313 of the first insulation layer 31 and the shield portion 323 of the second insulation layer 32 are in contact with each other. The intermediate insulation layer 33 is formed of an oxide such as $SiO_2$. The intermediate insulation layer 33 has a thickness of, for example, 0.8 μm to 3.0 μm.

The intermediate insulation layer 33 includes a main surface 331 and a back surface 332. The main surface 331 is in contact with the main surface 321 of the second insulation layer 32. The back surface 332 is in contact with the main surface 311 of the first insulation layer 31. In this embodiment also, the back surface 322 of the second insulation layer 32 is disposed more distant from the functional surface 11 in the z-direction than is the main surface 20 of the terminal layer 2. More specifically, the back surface 322 is located at a position offset by a distance Gp in the z-direction from the main surface 20 of the terminal layer 2. Further, the main surface 331 of the intermediate insulation layer 33 is flush with the portion of the main surface 311 corresponding to the shield portion 313 of the first insulation layer 31. In addition, in this embodiment the retracted portion 314 of the first insulation layer 31 in the insulation layer 3 is thinner than the terminal layer 2.

In a manufacturing method of the semiconductor device A2, the intermediate insulation layer 33 may be formed, for example, by depositing, after forming the first insulation layer 31, a thin film of $SiO_2$ through a thin film deposition process such as CVD, so as to cover the first insulation layer 31. After the intermediate insulation layer 33 is formed, surface polishing may be performed to expose the first insulation layer 31 from the intermediate insulation layer 33, thus to make the main surface 331 of the intermediate insulation layer 33 flush with the portion of the main surface 311 corresponding to the shield portion 313 of the first insulation layer 31. Thus, the shield portion 313 of the first insulation layer 31 becomes thinner than the retracted portion 314.

The configuration according to the second embodiment can also serve to suppress the occurrence of a crack in the insulation layer 3. In addition, the insulation layer 3 includes the intermediate insulation layer 33, which is disposed between the retracted portion 314 of the first insulation layer 31 and the retracted portion 324 of the second insulation layer 32. Such a configuration allows the extent of constriction of the insulation layer 3 to be more effectively reduced, to thereby more effectively suppress the occurrence of a crack in the insulation layer 3. In particular, the portion of the main surface 311 corresponding to the shield portion 313 of the first insulation layer 31 and the main surface 331 of the intermediate insulation layer 33 are flush with each other. This is advantageous to preventing the insulation layer 3 from becoming prominently constricted, thereby effectively preventing the occurrence of a crack in the insulation layer 3. It should be noted here that similar results to those of the semiconductor device A1 ware obtained through a thermal cycle test carried out with respect to the semiconductor device A2.

Figure 13:
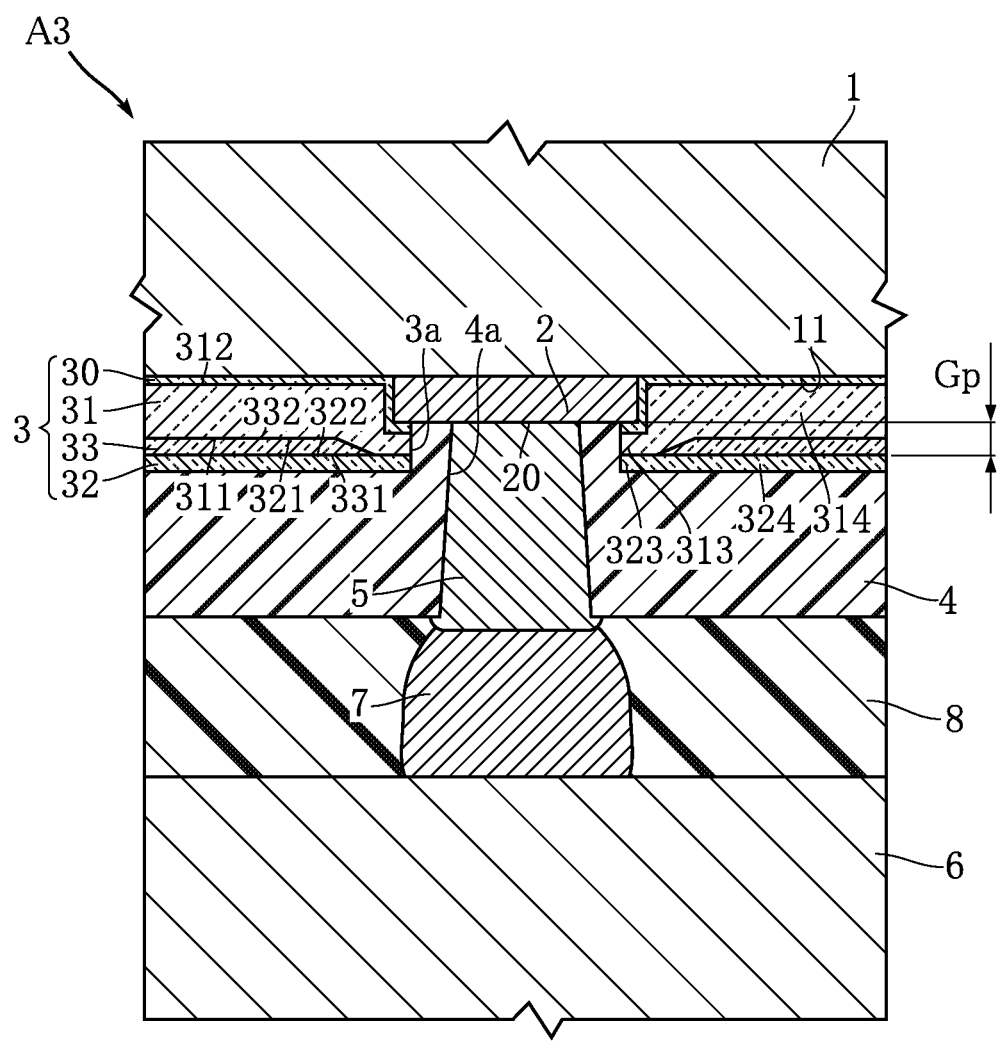
FIG. 13 is an enlarged fragmentary cross-sectional view showing a semiconductor device according to a third embodiment of the present invention.

FIG. 13 illustrates a semiconductor device according to a third embodiment of the present invention. The semiconductor device A3 of this embodiment is different from the semiconductor devices A1, A2 mainly in the configuration of the insulation layer 3. In this embodiment, the insulation layer 3 includes an underlying insulation layer 30, a first insulation layer 31, a second insulation layer 32, and an intermediate insulation layer 33. The retracted portion 314 of the first insulation layer 31 is thicker than the terminal layer 2. In this embodiment, accordingly, the intermediate insulation layer 33 is thinner than the intermediate insulation layer 33 of the semiconductor device A2, for example.

The configuration of the third embodiment can also suppress the occurrence of a crack in the insulation layer 3. In addition, in this embodiment the retracted portion 314 of the first insulation layer 31 is thicker than the terminal layer 2. In other words, the terminal layer 2 is thinner than the retracted portion 314 of the first insulation layer 31. Such a configuration can alleviate the constriction in the insulation layer 3 and allow the main surface 311 of the first insulation layer 31 and the main surface 331 of the intermediate insulation layer 33 to be flush with each other, while also allowing the intermediate insulation layer 33 to have a relatively small thickness. The thermal cycle test carried out with respect to the semiconductor device A3 showed that none of five samples of the semiconductor device A3 suffered the occurrence of a crack after undergoing 1000 cycles of the thermal cycle test.

Figure 14:
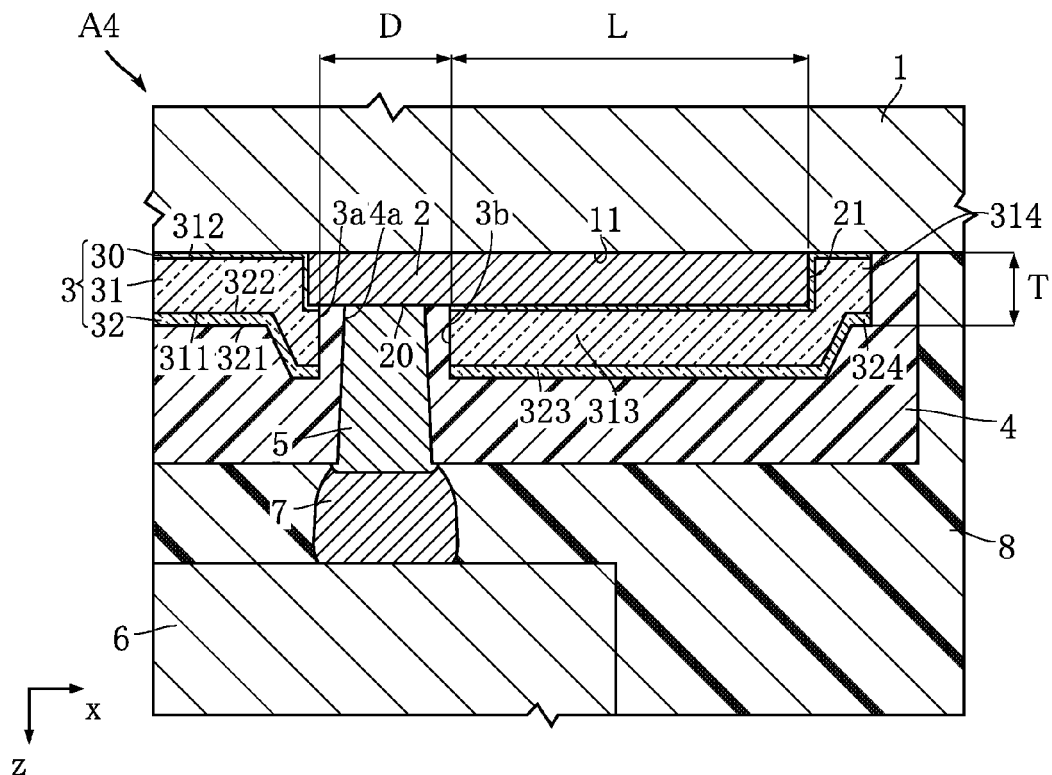
FIG. 14 is an enlarged fragmentary cross-sectional view showing a semiconductor device according to a fourth embodiment of the present invention.

FIG. 14 illustrates a semiconductor device according to a fourth embodiment of the present invention. In the semiconductor device A4, as shown in the figure, the positional relationship between the terminal layer 2 and the outer conductive member 6 (via the inner conductive member 5 and the conductive bonding member 7) is specified. In addition, the positional relationship between the respective ends of the terminal layer 2, insulation layer 3 and protection layer 4 (as viewed along the x-direction that is perpendicular to the z-direction) is specified. The other configurations relating to, for example, the inner conductive member 5 and the conductive bonding member 7 may be substantially the same or similar to those explained above with respect to the semiconductor devices A1 to A3.

Specifically, in the fourth embodiment, the terminal layer 2 has an end 21 (the right-side end in the figure) that faces in the x-direction. Similarly, the opening 3a of the insulation layer 3 has an end 3b. A distance L measured in the x-direction is defined between the end 21 of the terminal layer 2 and the end 3b of the opening 3a. In this embodiment, the quotient (in percentage) of the distance L divided by the size D of the opening 3a (also measured in the x-direction) is 20 or more. In this embodiment, the opening 3a of the insulation layer 3 is rectangular in a plan view, and the opening size D is equal to the length of a side of the rectangle extending in the x-direction. Alternatively, when the opening 3a is circular in a plan view, the opening size D corresponds to the diameter of the circle. In this embodiment, the quotient (in percentage) of the opening size D divided by a thickness T of the insulation layer 3 is 70 or more.

As shown in FIG. 14, the insulation layer 3 includes a portion laterally protruding beyond the end 21 of the terminal layer 2. The protruding portion of the layer 3 includes a retracted portion 314 of the first insulation layer 31 and a retracted portion 324 of the second insulation layer 32. The protection layer 4 also includes a portion laterally protruding beyond the end 21 of the terminal layer 2, and this protruding portion of the layer 4 includes a portion laterally protruding beyond and end of the insulation layer 3 (in the figure, the right-side end facing in the x-direction). With configurations according to the fourth embodiment, it is possible to suppress the occurrence of a crack in the insulation layer 3.

Figure 15:
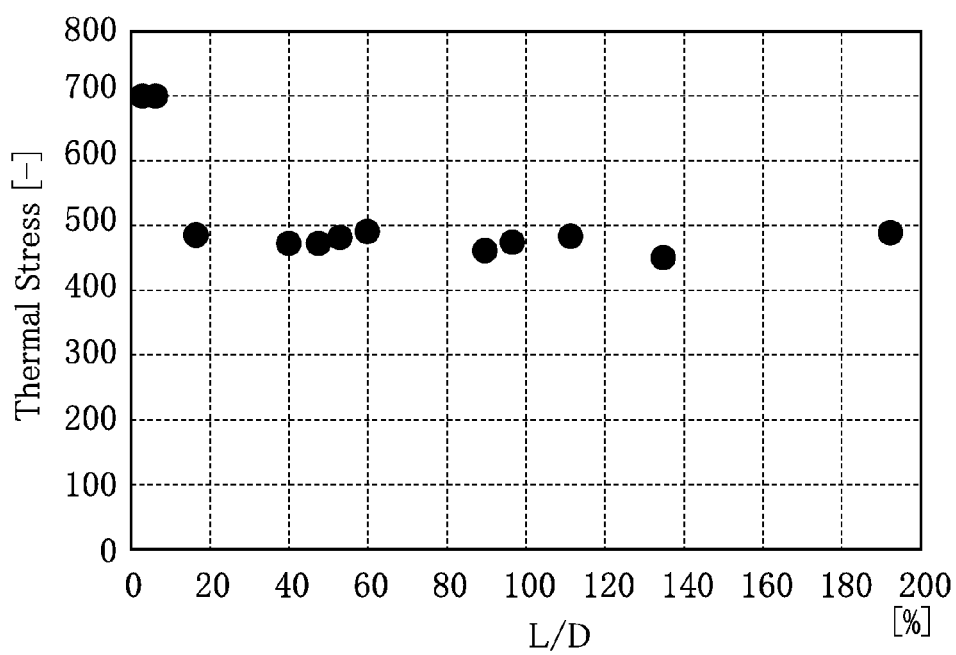
FIG. 15 is a graph illustrating thermal stress generated in an insulation layer.

FIG. 15 is a graph showing the thermal stress generated in a portion of the insulation layer 3 between the shield portion 313 and the retracted portion 314 (or between the shield portion 323 and the retracted portion 324). The vertical axis corresponds to a non-dimensional index representing a relative magnitude of the thermal stress. The horizontal axis represents the quotient (in percentage) of the distance L divided by the opening size D.

As seen from FIG. 15, when L/D is about 10% or less, the thermal stress is about 700, while the thermal stress is about 500 or less (but substantially constant) when L/D is 18% or more. Such a tendency also holds for the thermal stress in relation to the quotient of the opening size D divided by the thickness T. Specifically, when D/T increases up to about 70%, the thermal stress decreases to about 500% or less, and remains substantially constant as D/T becomes greater than 70%.

The present invention is not limited to the foregoing embodiments. The configurations of a semiconductor device according to the present invention may be modified in various ways.

The invention claimed is:
1. A semiconductor device comprising:
a semiconductor chip including a functional surface that forms an integrated circuit;
a terminal layer formed on the functional surface;
an insulation layer covering a part of the terminal layer and formed with an insulation layer opening exposing another part of the terminal layer;
a protection layer covering the insulation layer and formed with a protection layer opening exposing a part of the terminal layer;
an inner conductive member that is held in contact with a terminal layer main surface of the terminal layer, that extends through the insulation layer opening and the protection layer opening, and that is exposed from the protection layer;
an outer conductive member disposed at a position facing the functional surface; and
a conductive bonding member that connects the inner conductive member and the outer conductive member,
wherein the insulation layer includes a first insulation layer and a second insulation layer, the first insulation layer facing the functional surface of the semiconductor chip at a first side thereof and facing the second insulation layer at a second side thereof in a thickness direction of the semiconductor device,
the second insulation layer includes a second insulation layer shield portion and a second insulation layer retracted portion, the second insulation layer shield portion overlapping with the terminal layer in plan view, the second insulation layer retracted portion not overlapping with the terminal layer in plan view,
the second insulation layer retracted portion has a second insulation layer front surface and a second insulation layer back surface closer to the functional surface than is the second insulation layer front surface, the second insulation layer back surface being more distant from the functional surface than is the terminal layer main surface in the thickness direction,
each of the first insulation layer and the second insulation layer shield portion includes an end surface facing the inner conductive member, the end surface of the first insulation layer being flush with the end surface of the second insulation layer shield portion,
a part of the protection layer is disposed between the inner conductive member and the end surface of the first insulation layer in plan view and disposed between the inner conductive member and the end surface of the second insulation layer shield portion in plan view, and
the part of the protection layer is held in contact with the terminal layer main surface of the terminal layer.

2. The semiconductor device according to claim 1, wherein the second insulation layer is in contact with the protection layer.

3. The semiconductor device according to claim 1, wherein the first insulation layer includes a first insulation layer shield portion and a first insulation layer retracted portion, the first insulation layer shield portion overlapping with the terminal layer in plan view, the first insulation layer retracted portion not overlapping with the terminal layer in plan view.

4. The semiconductor device according to claim 1, wherein the protection layer opening is disposed within the insulation layer opening in plan view.

5. The semiconductor device according to claim 1, wherein the protection layer is made of a polyimide resin.

6. The semiconductor device according to claim 1, wherein the first insulation layer is made of an oxide.

7. The semiconductor device according to claim 1, wherein the second insulation layer is made of a nitride.

8. The semiconductor device according to claim 1, wherein the insulation layer includes an underlying insulation layer disposed between the functional surface and the first insulation layer.

9. The semiconductor device according to claim 1, wherein the terminal layer has a terminal layer end at an end thereof in a first direction perpendicular to the thickness direction,
the insulation layer opening has an insulation layer opening end in the first direction, and
a distance between the terminal layer end and the insulation layer opening end in the first direction is equal to or greater than 20% of a size of the insulation layer opening in the first direction.

10. The semiconductor device according to claim 1, wherein the outer conductive member is formed by a lead frame.

11. The semiconductor device according to claim 1, further comprising a sealing resin covering the semiconductor chip.

12. The semiconductor device according to claim 3, wherein the first insulation layer shield portion and the second insulation layer shield portion are in contact with each other.

13. The semiconductor device according to claim 6, wherein the first insulation layer is made of $SiO_2$.

14. The semiconductor device according to claim 7, wherein the second insulation layer is made of SiN.

15. The semiconductor device according to claim 8, wherein the underlying insulation layer is made of a nitride.

16. The semiconductor device according to claim 9, wherein the insulation layer opening is rectangular in plan view.

17. The semiconductor device according to claim 9, wherein the distance between the terminal layer end and the insulation layer opening end in the first direction is equal to or greater than 70% of a thickness of the insulation layer.

18. The semiconductor device according to claim 9, wherein the insulation layer protrudes beyond the terminal layer end in plan view.

19. The semiconductor device according to claim 11, wherein a part of the outer conductive member is exposed from the sealing resin.

20. The semiconductor device according to claim 12, wherein the first insulation layer retracted portion and the second insulation layer retracted portion are in contact with each other.

21. The semiconductor device according to claim 12, wherein the insulation layer includes an intermediate insulation layer disposed between the first insulation layer retracted portion and the second insulation layer retracted portion.

22. The semiconductor device according to claim 15, wherein the underlying insulation layer is made of SiN.

23. The semiconductor device according to claim 18, wherein the protection layer protrudes beyond the terminal layer end in plan view.

24. The semiconductor device according to claim 21, wherein the first insulation layer shield portion includes a first surface and a second surface, the first surface of the first insulation layer shield portion including a first insulation layer main surface, the second surface of the first insulation layer shield portion facing the functional surface, the intermediate insulation layer includes a first surface and second surface, the first surface of the intermediate insulation layer includes an intermediate insulation layer main surface, the second surface of the intermediate insulation layer facing the functional surface, the first insulation layer main surface is flush with the intermediate insulation layer main surface, and each of the first insulation layer main surface and the intermediate insulation layer main surface is held in contact with the second insulation layer back surface.

25. The semiconductor device according to claim 21, wherein the intermediate insulation layer is made of an oxide.

26. The semiconductor device according to claim 23, wherein the protection layer protrudes beyond the insulation layer in plan view.

27. The semiconductor device according to claim 25, wherein the intermediate insulation layer is made of $SiO_2$.

* * * * *